United States Patent [19]

Saeki

[11] Patent Number: 4,740,825
[45] Date of Patent: Apr. 26, 1988

[54] MOS SEMICONDUCTOR DEVICE HAVING A LOW INPUT RESISTANCE AND A SMALL DRAIN CAPACITANCE

[75] Inventor: Yukihiro Saeki, Yokohama, Japan

[73] Assignee: Tokyo Shibaura Denki Kabushiki Kaisha, Kawasaki, Japan

[21] Appl. No.: 9,553

[22] Filed: Jan. 30, 1987

Related U.S. Application Data

[63] Continuation of Ser. No. 563,099, Dec. 16, 1983, abandoned.

[30] Foreign Application Priority Data

Dec. 27, 1982 [JP] Japan ................................ 57-234015

[51] Int. Cl.$^4$ ............................................. H01L 27/02
[52] U.S. Cl. ......................................... 357/41; 357/68; 357/42; 357/59; 357/23.14
[58] Field of Search ....................... 357/42, 92, 59, 23.1, 357/23.14, 23.7, 68, 41

[56] References Cited

U.S. PATENT DOCUMENTS

| | | | |
|---|---|---|---|
| 4,152,717 | 5/1979 | Satov et al. ......................... | 357/42 |
| 4,481,524 | 11/1984 | Tsujide ................................ | 357/59 J |
| 4,541,006 | 9/1985 | Ariizumi et al. .................... | 357/41 |

FOREIGN PATENT DOCUMENTS

| | | |
|---|---|---|
| 0029099 | 5/1981 | European Pat. Off. . |
| 2239821 | 2/1975 | France . |
| 1481566 | 8/1977 | United Kingdom ................. 357/42 |

OTHER PUBLICATIONS

Nijhuis et al., "Semiconductor Interface Circuit," *IBM Tech. Disclosure Bulletin*, vol. 19, No. 10, Mar. 1977.
IBM Technical Disclosure Bulletin, vol. 19, No. 10, pp. 3741–3742, Mar. 1977.

*Primary Examiner*—Andrew J. James
*Assistant Examiner*—William A. Mintel
*Attorney, Agent, or Firm*—Finnegan, Henderson, Farabow, Garrett and Dunner

[57] ABSTRACT

An opening is formed at a position substantially midway along the widthwise direction of a wide metal wiring layer formed on a semiconductor substrate. A second metal wiring layer is formed in the opening in the same step for forming the wide first metal wiring layer. Drain electrodes of a CMOS inverter formed below the wide first metal wiring layer are connected to the second metal wiring layer through contact holes. The second metal wiring layer is connected to a polycrystalline silicon layer as an output wiring layer through a contact hole.

38 Claims, 3 Drawing Sheets

MOS SEMICONDUCTOR DEVICE HAVING A LOW INPUT RESISTANCE AND A SMALL DRAIN CAPACITANCE

This application is a continuation of application Ser. No. 563,099, filed Dec. 16, 1983, now abandoned.

BACKGROUND OF THE INVENTION

The present invention relates to an MOS semiconductor device in which a logic circuit having a low input resistance and a small drain capacitance is formed below a wide power supply wiring layer.

In an output circuit of an I/O (Input/Output) port of an LSI (Large Scale Integrated Circuit) in a microcomputer or the like, a buffer circuit for producing data outside the LSI is arranged. A transistor having a relatively high conductance is used for such an output buffer circuit since a large current of 1.6 mA flows to the buffer circuit at a low output voltage VOL of 0.4 V, for example. In an LSI for a microcomputer, a number of transistors having a relatively high conductance is used. An LSI of an 8-bit microcomputer having two I/O ports requires a total of 24 (8×3) output buffers (two I/O ports and one data bus port). Thus, the power supply line for all the I/O ports is a very wide metal wiring layer.

A power supply line comprising such a wide metal wiring layer increases the pattern area and is not preferable for an LSI. However, the use of a wide metal wiring layer as a power supply line cannot be avoided in view of the electrical characteristics as described above. For this reason, there is a demand to effectively utilize a region below such a wide power supply line. An example will be considered wherein an inverter is formed below a wide power supply line in a CMOS (Complementary Metal Oxide Semiconductor) integrated circuit.

FIG. 1 shows a CMOS inverter which is formed below a wide power supply line. Referring to FIG. 1, a first metal wiring layer 11 of aluminum or the like supplies a signal A, a second metal wiring layer 12 of aluminum or the like supplies a power supply voltage VDD, and a third metal wiring layer 13 of aluminum or the like is at ground potential. The third metal wiring layer 13 is formed in a very wide pattern. A p-type well region 14 is formed in an n-type semiconductor substrate 10. A source region 151 and a drain region 152 in the p-type well region 14 comprise an n+-type diffusion layer. A source electrode S1, a gate electrode G1, and a drain electrode D1 are formed in the p-type well region 14. A source region 161 and a drain region 162 of a p+-type diffusion layer are formed outside the p-type well region 14 on the semiconductor substrate 10. A source electrode S2, a gate electrode G2, and a drain electrode D2 are formed outside the p-type well region 14.

The gate electrodes G1 and G2 are connected to a first polycrystalline silicon layer 17 formed below the first through third metal wiring layers 11 to 13. The first polycrystalline silicon layer 17 is connected to the first metal wiring layer 11 through a contact hole C1. The drain electrode D1 is connected to a fourth metal wiring layer 18 of aluminum or the like through contact holes C2 and C3. The fourth metal wiring layer 18 is connected to an underlying second polycrystalline silicon layer 19 through a contact hole C4. An inverted signal $\overline{A}$ of the signal A supplied through the first metal wiring layer 11 is obtained from the second polycrystalline silicon layer 19. The source electrode S1 is connected to the third metal wiring layer 13 through a contact hole C5. The source electrode S2 is connected to the second metal wiring layer 12 through a contact hole C6. In this manner, a CMOS inverter for inverting the input signal A and producing an inverted signal $\overline{A}$ is obtained.

In the CMOS inverter shown in FIG. 1, the signal A is supplied to the gate electrodes G1 and G2 through the long, first polycrystalline silicon layer 17 below the third metal wiring layer 13. This is for reducing the areas of the drain regions 152 and 162 to decrease the output capacitance for high speed operation of the CMOS inverter. However, in the CMOS inverter shown in FIG. 1, since the first polycrystalline silicon layer 17 is long, the input resistance of the CMOS inverter is increased. This results in a lower operation speed of the CMOS inverter.

FIG. 2 shows a CMOS inverter wherein the length of the first polycrystalline silicon layer 17 shown in FIG. 1 is short to reduce the input resistance of the CMOS inverter. However, in this case, since the areas of drain regions 152 and 162 of the CMOS inverter increase, the junction capacitance of the drain is increased and the operation speed of the CMOS inverter is reduced. In FIG. 2, the same reference numerals as used in FIG. 1 denote the same parts.

SUMMARY OF THE INVENTION

It is an object of the present invention to provide an MOS semiconductor device which is capable of high speed operation of an MOS logic circuit formed below a wide power supply line by reducing an input resistance and a drain capacitance.

According to the present invention, there is provided an MOS semiconductor device comprising: a semiconductor substrate; a power supply metal wiring layer formed on said semiconductor substrate; an opening formed at a position substantially midway along a widthwise direction of said metal wiring layer; a contact layer formed in said opening as isolated from said metal wiring layer; an MOS logic circuit including at least one MOSFET having a drain and source formed below said metal wiring layer; means for connecting said drain to said contact layer; and an output wiring layer of said MOS logic circuit, which is conencted to said contact layer.

According to the present invention, the input resistance and drain capacitance of the MOS logic circuit formed below a wide power supply line can be reduced, so that an MOS semiconductor device which can operate the MOS logic circuit at high speed, can be obtained.

DETAILED DESCRIPTION OF THE PREFERRED EMBODIMENT

Figure 2:
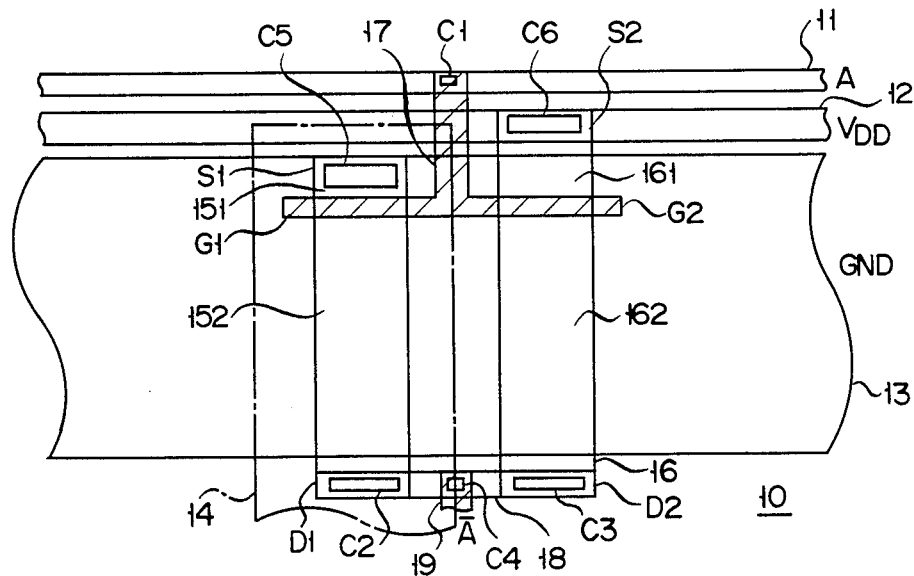
Figure 3:
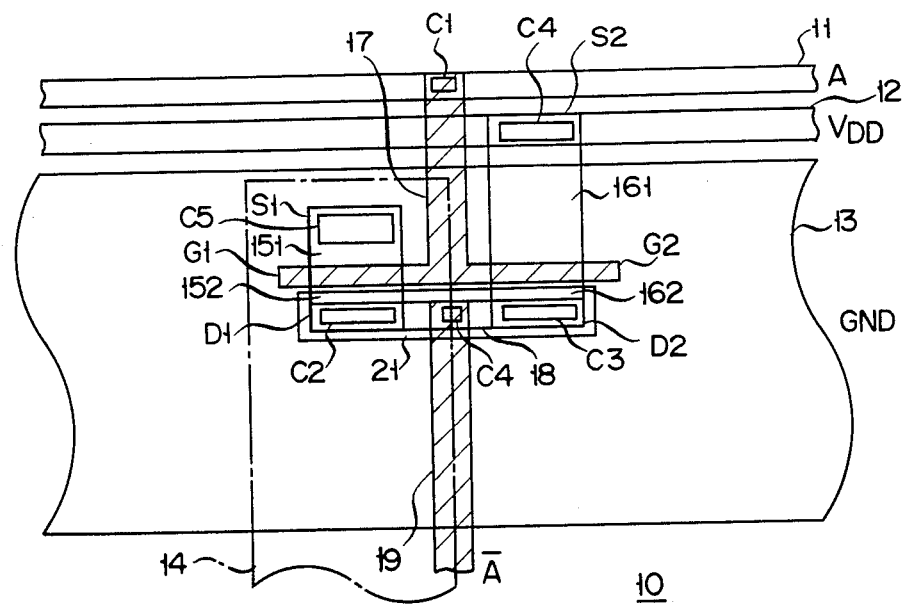
FIG. 3 is a view showing a CMOS inverter according to an embodiment of the present invention.

The preferred embodiment of the present invention will now be described with reference to the accompanying drawings. Referring to FIG. 3, the same reference numerals as used in FIGS. 1 and 2 denote the same parts, and a detailed description thereof will be omitted. An opening 21 is formed at substantially the center of a third metal wiring layer 13. A contact layer formed in the same step for forming the layer 13, that is, a fourth metal wiring layer 18, is formed in the opening 21. Thus, drain electrode D1 and D2 are connected to the fourth metal wiring layer 18 through contact holes C2 and C3. The fourth metal wiring layer 18 is also connected to a second polycrystalline silicon layer 19 through a contact hole C4. An inverted signal $\overline{A}$ of a signal A supplied through a first polycrystalline silicon layer 17 is obtained through a second polycrystalline silicon layer 19.

Figure 1:
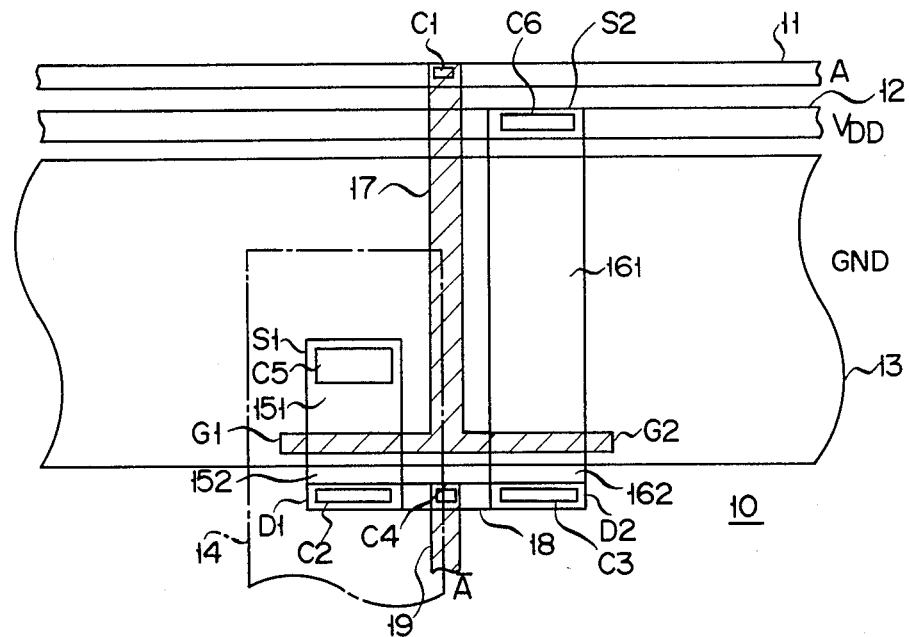
FIGS. 1 and 2 are views showing conventional CMOS inverters, respectively.

In the embodiment described above, the length of the first polycrystalline silicon layer 17 shown in FIG. 3 is about half of that of the first polycrystalline silicon layer 17 shown in FIG. 1. Thus, the input resistance of the CMOS inverter shown in FIG. 3 can be reduced. In addition, the areas of drain regions 152 and 162 of the CMOS inverter shown in FIG. 3 are significantly smaller than those of the CMOS inverter shown in FIG. 2. For this reason, the drain capacitance of the CMOS inverter can be significantly reduced. Since the input resistance and the drain capacitance of the CMOS inverter can be reduced, the CMOS inverter can operate at high speed.

If a CMOS inverter in which an input signal is obtained from a metal wiring layer lying below the third metal wiring layer 13 and an output signal is obtained from a metal wiring layer lying above the layer 13 is formed below the metal wiring layer 13, and if the opening 21 is formed at a position substantially midway along the widthwise direction of the layer 13, the input resistance and the drain capacitance can be significantly reduced.

The second polycrystalline silicon layer 19 of the CMOS inverter shown in FIG. 3 has a length substantially half the width of the third metal wiring layer 13. Thus, the resistance of the second polycrystalline silicon layer 19 would apparently interfere with high-speed operation of the CMOS inverter. However, this can be prevented by forming a sufficiently wide second polycrystalline silicon layer.

Figure 4:
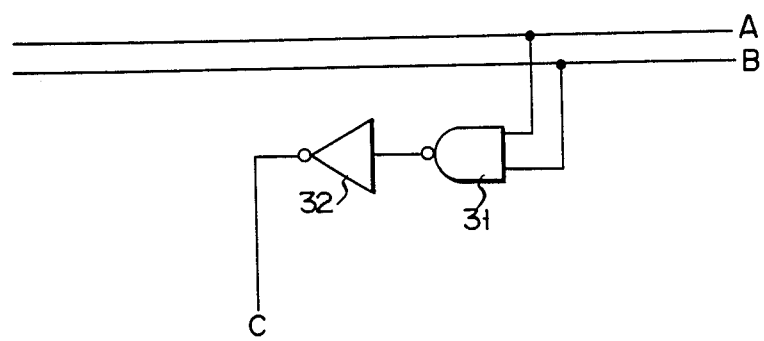
FIG. 4 is a circuit diagram of a logic circuit according to another embodiment of the present invention.

Another embodiment of the present invention will now be described with reference to FIGS. 4 and 5. FIG. 4 is a circuit diagram of the logic circuits realized by the structure shown in FIG. 5. Referring to FIG. 4, signals A and B are supplied to a NAND circuit 31, which produces an output signal C through an inverter 32. The NAND circuit 31 and the inverter 32 are CMOSFETs.

Figure 5:
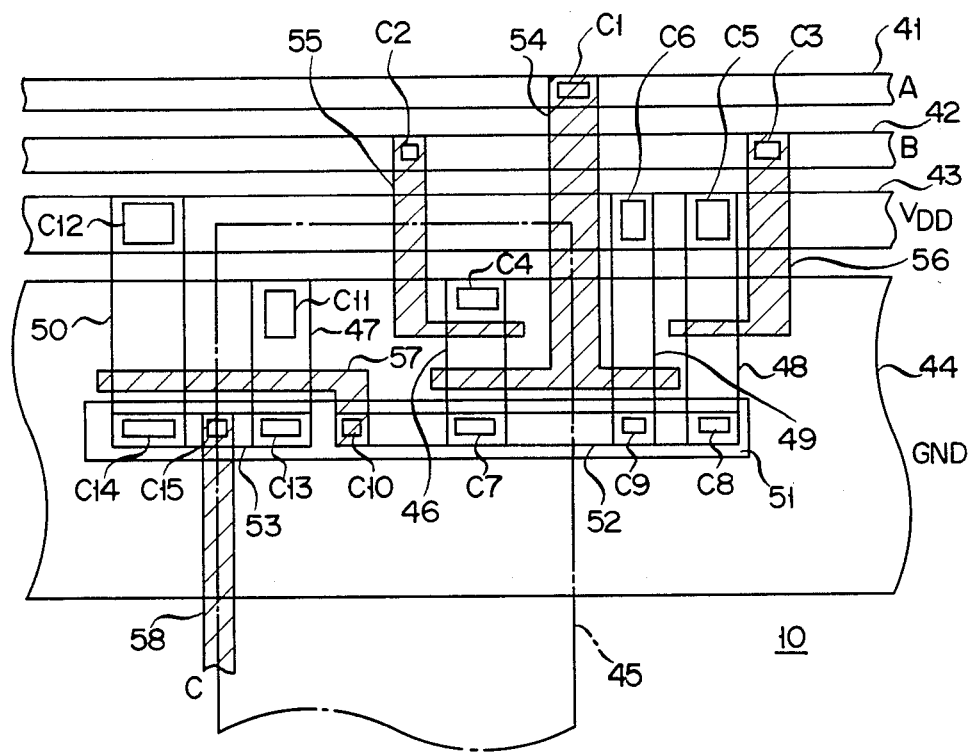
FIG. 5 is a view showing an MOS semiconductor device realizing the logic circuit shown in FIG. 4.

Referring to FIG. 5, a first metal wiring layer 41 of aluminum or the like supplies a signal A, a second metal wiring layer 42 of aluminum or the like supplies a signal B, a third metal wiring layer 43 of aluminum or the like supplies a power supply voltage VDD, and a fourth metal wiring layer 44 of aluminum or the like is at ground potential. The fourth metal wiring layer 44 has a very wide pattern. A p-type well region 45 is formed in an n-type semiconductor substrate 10. N-channel MOSFETS 46 and 47 are formed in the p-type well region 45. P-channel MOSFETS 48 to 50 are formed outside the p-type well region 45 of the semiconductor substrate 10. The n-channel MOSFET 46 and the p-channel MOSFETS 48 and 49 constitute a NAND circuit, and the n-channel MOSFET 47 and the p-channel MOSFET 50 constitute an inverter 32.

An opening 51 is formed at a position substantially midway along a widthwise direcion of the fourth metal wiring layer 44. Fifth and sixth metal wiring layers 52 and 53 of aluminum or the like are formed in the opening 51 as contact layers and are formed in the same step as that for forming the fourth metal wiring layer 44. The first metal wiring layer 41 is connected to one end of a first polycrystalline silicon layer 54 through a contact hole C1. The other end of the first polycrystalline silicon layer 54 is connected to the gates of the n- and p-channel MOSFETS 46 and 49. The second metal wiring layer 42 is connected to one end of a second polycrystalline silicon layer 55 through a contact hole C2. The other end of the second polycrystalline silicon layer 55 is connected to the gate of the n-channel MOSFET 46. The second metal wiring layer 42 is also connected to one end of a third polycrystalline silicon layer 56 through a contact hole C3. The other end of the third polycrystalline silicon layer 56 is connected to the gate of the p-channel MOSFET 48.

The source electrode of the n-channel MOSFET 46 is connected to the fourth metal wiring layer 44 thourhg a contact hole C4, and the source electrodes of the p-channel MOSFETs 48 and 49 are connected to the third metal wiring layer 43 through contact holes C5 and C6, respectively. The drain electrodes of the n-channel MOSFET 46 and the p-channel MOSFETs 48 and 49 are connected to the fifth metal wiring layer 52 through contact holes C7 to C9, respectively. The fifth metal wiring layer 52 is connected to one end of a fourth polycrystalline silicon layer 57 through a contact hole C10. The other end of the polycrystalline silicon layer 57 is connected to the gate electrodes of the n- and p-channel MOSFETs 47 and 50. The source electrode of the n-channel MOSFET 47 is connected to the fourth metal wiring layer 44 through a contact hole C11, and the source electrode of the p-channel MOSFE 50 is connected to the third metal wiring layer 43 through a contact hole C12. The drain electrodes of the n- and p-channel MOSFETs 47 and 50 are connected to the sixth metal wiring layer 53 through contact holes C13 and C14, respectively. The sixth metal wiring layer 53 is connected to a fifth polycrystalline silicon layer 58 through a contact hole C15. A signal C is obtained from the fifth polycrystalline silicon layer 58.

According to the embodiment described above, the lengths of the first through third polycrystalline silicon layers 54 to 56 are substantially half the length of the polycrystalline silicon layer 17 shown in FIG. 1. Therefore, the input resistance of the logic circuit shown in FIG. 5 can be reduced. Moreover, the drain regions of the n-channel MOSFETs 46 and 47 and those of the p-channel MOSFETs 48 to 50 are significantly smaller than those of the CMOS inverter shown in FIG. 2. Thus, the drain capacitance of the logic circuit shown in FIG. 5 can be significantly reduced. Since the input resistance and drain capacitance of the logic circuit shown in FIG. 5 can be reduced, the logic circuit can operate at high speed. Since the width of the fifth polycrystalline silicon layer 58 is sufficiently great, high-speed operation of the CMOS inverter is not interfered with as in the case of the former embodiment of the present invention.

The input resistance and the drain capacitance can be significantly reduced when a logic circuit consisting of a series circuit of a CMOS NAND gate and a CMOS inverter is formed below the fourth metal wiring layer 44 and if an opening 51 is formed at a position substantially midway along the widthwise direction of the fourth metal wiring layer 44, an input signal is obtained from the metal wiring layer lying below the fourth metal wiring layer 44 and an output signal is supplied to the metal wiring layer lying above the fourth metal wiring layer 44 in the CMOS NAND gate.

In the embodiments described above, the opening 21 or 51 is formed at a position substantially midway along the widthwise direction of the third or fourth metal wiring layer 13 or 44, respectively. However, the position of the opening is not limited to this.

What is claimed is:

1. An MOS semiconductor device which comprises:
a semiconductor substrate;
an insulation layer disposed upon said substrate;
a metal wiring layer for a power supply line formed on said insulation layer;
an MOS logic circuit including at least one MOSFET having a drain and a source formed below said metal wiring layer;
means for reducing the input resistance and drain capacitance of said MOS logic circuit including an opening formed in said metal wiring layer and a metal contact layer formed in said opening as isolated from said metal wiring layer;
means for connecting said drain to said contact layer; and
an output wiring layer of said MOS logic circuit, which is connected to said contact layer.

2. An MOS semiconductor device which comprises:
semiconductor substrate;
an insulation layer disposed upon said substrate;
a metal wiring layer for a power supply line formed on said insulation layer;
an MOS logic circuit including at least one MOSFET having a drain and a source formed below said metal wiring layer;
means for reducing the input resistance and drain capacitance of said MOS logic circuit including an opening formed at a position substantially midway along a width-wise direction of said metal wiring layer and a metal contact layer formed in said opening as isolated from said metal wiring layer;
means for connecting said drain of said MOS logic circuit to said contact layer; and
an output wiring layer of said MOS logic circuit, which is connected to said contact layer.

3. An MOS semiconductor device which comprises:
a semiconductor substrate;
an insulation layer disposed upon said substrate;
a first metal wiring layer for supplying an input signal and formed on said insulation layer;
a second metal wiring layer for supplying a power supply voltage and formed on said insulation layer;
a third metal wiring layer for a power supply line formed on said insulation layer;
a CMOS inverter comprising n- and p-channel MOSFETs and formed below said third metal wiring layer;
means for reducing the input resistance and drain capacitance of said CMOS inverter including an opening formed at a position substantially midway along a widthwise direction of said third metal wiring layer and a metal contact layer formed in said opening as isolated from said third metal wiring layer;
means for connecting drains of n- and p-channel MOSFETs constituting said CMOS inverter to two ends of said contact layer;
an input wiring layer having one end connected to said first metal wiring layer and another end connected to gates of said n-and p-channel MOSFETs constituting said CMOS inverter;
an output wiring layer having one end connected to said contact layer;
means for connecting a source of said p-channel MOSFET constituting said CMOS inverter to said second metal wiring layer; and
means for connecting a source of said n-channel MOSFET constituting said CMOS inverter to said third metal wiring layer.

4. An MOS semiconductor device according to claim 3, wherein said input wiring layer is formed to extend substantially perpendicular to said third metal wiring layer and has said another end formed in a T-shape.

5. An MOS semiconductor device according to claim 3, wherein said output wiring layer is formed substantially perpendicular to said third metal wiring layer and has said one end connected to substantially a center of said contact layer.

6. An MOS semiconductor device according to claim 3, wherein said first and second metal wiring layers are formed near one side of said third metal wiring layer.

7. An MOS semiconductor device which comprises:
a semiconductor substrate;
an insulation layer disposed upon said substrate;
a first metal wiring layer for supplying a first input signal and formed on said insulation layer;
a second metal wiring layer for supplying a second input signal and formed on said insulation layer;
a third metal wiring layer for supplying a power supply voltage and formed on said insulation layer;
a fourth metal wiring layer for a power supply line formed on said insulation layer;
an opening formed in said fourth metal wiring layer;
first and second contact layers formed in said opening as isolated from said fourth metal wiring layer;
means for connecting to said first contact layer drains of a plurality of n-channel MOSFETs and a plurality of p-channel MOSFETs constituting a CMOS logic circuit;
means for connecting drains of n- and p-channel MOSFETs constituting a CMOS inverter to two ends of said second contact layer;
a first input wiring layer having one end connected to said first metal wiring layer and the other end connected to gates of at least n-channel MOSFETs of said CMOS logic circuit;
a connecting wiring layer having one end connected to one end of said first contact layer and the other end connected to gates of said n- and p-channel MOSFETs constituting said CMOS inverter;
an output wiring layer having one end connnected to said second contact layer;
means for connecting sources of said p-channel MOSFETs of said CMOS logic circuit and of said CMOS inverter to said third metal wiring layer; and
means for connecting sources of said n-channel MOSFETs of said CMOS logic circuit and of said CMOS inverter to said fourth metal wiring layer.

8. An MOS semiconductor device according to claim 7, wherein said CMOS logic circuit is a CMOS NAND gate comprising n-channel and p-channel MOSFETs.

9. An MOS semiconductor device which comprises:
a semiconductor substrate;
an insulation layer disposed upon said substrate;
a first metal wiring layer for supplying a first input signal and formed on said insulation layer;
a second metal wiring layer for supplying a second input signal and formed on said insulation layer;
a third metal wiring layer for supplying a power supply voltage and formed on said insulation layer;
a fourth metal wiring layer for a power supply line formed on said insulation layer;
an opening formed at a position substantially midway along the widthwise direction of said fourth metal wiring layer;
first and second contact layers formed in said opening as isolated from said fourth metal wiring layer;
means for connecting drains of an n-channel MOSFET and first and second p-channel MOSFETs constituting a CMOS NAND gate to said first contact layer;
means for connecting drains of n- and p-channel MOSFETs constituting a CMOS inverter to two ends of said second contact layer;
a first input wiring layer having one end connected to said first metal wiring layer and the other end connected to gates of said n-channel MOSFET and said first p-channel MOSFET of said CMOS NAND gate;
a second input wiring layer having one end connected to said second metal wiring layer and the other end connected to said gate of said n-channel MOSFET fo said CMOS NAND gate;
a third metal wiring layer having one end connected to said second metal wirng layer and the other end connected to a gate of said second p-channel MOSFET of said CMOS NAND gate;
a connecting wiring layer having one end connected to one end of said first contact layer and the other end connected to gates of said n- and p-channel MOSFETs constituting said CMOS inverter;
an output wiring layer having one end connected to said second contact layer;
means for connecting to said third metal wiring layer sources of said first and second p-channel MOSFETs of said CMOS NAND gate and of said p-channel MOSFET of said CMOS inverter; and
means for connecting sources of said n-channel MOSFETs of said CMOS NAND gate and of said CMOS inverter to said fourth metal wiring layer.

10. An MOS semiconductor device according to claim 7 or 9, wherein said first input wiring layer is formed to extend substantially perpendicular to said fourth metal wiring layer and has said other end formed in a T-shape.

11. An MOS semiconductor device according to claim 9, wherein said second and third input wiring layers are formed to extend substantially perpendicular to said fourth metal wiring layer.

12. An MOS semiconductor device according to claim 7 or 9, wherein said output wiring layer is formed to extend substantially perpendicular to said fourth metal wiring layer and has said one end connected to substantially a center of said second contact layer.

13. An MOS semiconductor device according to claim 7 or 9, wherein said first through third metal wiring layers are formed on one side of said fourth metal wiring layer.

14. An MOS semiconductor device according to claim 3, wherein said first through third metal wiring layers consist of aluminum.

15. An MOS semiconductor device according to claim 7 or 9, wherein said first through fourth metal wiring layers consist of aluminum.

16. An MOS semiconductor device according to claim 3, wherein said input wiring layer and said output wiring layer consist of polycrystalline silicon.

17. An MOS semiconductor device according to claim 7, wherein said first input wiring layer, said connecting wiring layer and said output wiring layer consist of polycrystalline silicon.

18. An MOS semiconductor device according to claim 9, wherein said first through third input wiring layers, said connecting wiring layer and said output wiring layer consist of polycrystalline silicon.

19. An MOS semiconductor device which comprises:
a semiconductor substrate;
an insulation layer disposed upon said substrate;
a metal wiring layer having a first side and a second side, formed on said insulation layer, and serving as a power supply line;
an input metal wiring layer for supplying an input signal and formed along said first side of said metal wiring layer;
an opening formed in said metal wiring layer;
a metal contact layer formed in said opening and isolated from said metal wiring layer;
at least one MOSFET, having a drain, source, and gate, formed below said metal wiring layer;
a polycrystalline silicon input layer operatively coupled to and extending from said input metal wiring layer to the gate of the MOSFET;
means for connecting said drain to said contact layer; and
an output layer operatively coupled to and extending from said contact layer beyond said second side of said metal wiring layer.

20. An MOS semiconductor device according to claim 19, wherein said opening is formed at a position midway between said first and second sides of said metal wiring layer.

21. An MOS semiconductor device according to claim 19, wherein said output layer is polycrystalline silicon.

22. An MOS semiconductor device according to claim 19, wherein said power supply line is a ground line.

23. An MOS semiconductor device which comprises:
a semiconductor substrate;
an insulation layer disposed upon said substrate;
a metal wiring layer having a first side and a second side, formed on said insulation layer,and serving as a power supply line;
an input metal wiring layer for supplying an input signal and formed along said first side of said metal wiring layer;
an opening formed in said metal wiring layer;
a metal contact layer formed in said opening and isolated from said metal wiring layer, said metal contact layer and said metal wiring layer being flush with each other;
at least one MOSFET, having a drain, source, and gate, formed below said metal wiring layer;

a polycrystalline silicon input layer operatively coupled to and extending from said input metal wiring layer to the gate of the MOSFET;

means for connecting said drain to said contact layer; and an output layer operatively coupled to and extending from said contact layer beyond said second side of said metal wiring layer.

24. An MOS semiconductor device according to claim 23, wherein said opening is formed at a position midway between said first and second sides of said metal wiring layer.

25. An MOS semiconductor device according to claim 23, wherein said output layer is polycrystalline silicon.

26. An MOS semiconductor device according to claim 23, wherein said power supply line is a ground line.

27. An MOS semiconductor device which comprises:
a semicondcutor substrate;
an insulation layer disposed upon said substrate;
a first metal wiring layer for a first power supply line having a first side and a second side and formed on said insulation layer;
an input metal wiring layer formed along said first side of said first metal wiring layer;
a second metal wiring layer for a second power supply line formed along said first side of said first metal wiring layer;
an opening formed in said first metal wiring layer;
a metal contact layer formed in said opening and isolated from said first metal wiring layer;
at least a pair of complementary MOSFETs comprising an N tuype MOSFET and p type MOSFET, respectively, each having a drain, source, and gate, and each formed below said first metal wiring layer;
a polycrystalline silicon input layer extending from said input metal wiring layer to the gates of the complementary MOSFETs;
means for connecting said drains to said contact layer; and
an output layer operatively coupled to and extending from said contact layer beyond said second side of said first metal wiring layer.

28. An MOS semiconductor device according to claim 27, wherein said opening is formed at a position midway between said first and second sides of said first metal wiring layer.

29. An MOS semiconductor device according to claim 27, wherein said output layer is polycrystalline silicon.

30. An MOS semiconductor device according to claim 27, wherein said first metal wiring layer is a ground line and said second metal wiring layer is a line different from a ground line.

31. An MOS semiconductor device which comprises:
a semiconductor substrate;
an insulation layer disposed upon said substrate;
a metal wiring layer having a first side and a second side, formed on said insulation layer, and serving as a power supply line;
an input metal wiring layer for supplying an input signal and formed along said first side of said metal wiring layer;
an opening formed in said metal wiring layer;
a metal contact layer formed in said opening and isolated from said metal wiring layer;
at least two MOSFETs, each having a drain, source, and gate, and each formed below said metal wiring layer;
a polycrystalline silicon input layer operatively coupled to and extending from said input metal wiring layer to the gate of one of the at least two MOSFETs;
means for connecting said drain of another of the at least two MOSFETs to said contact layer; and
an output layer operatively coupled to and extending from said contact layer beyond said second side of said metal wiring layer.

32. An MOS semiconductor device according to claim 31, wherein said opening is formed at a position midway between said first and second sides of said metal wiring layer.

33. An MOS semiconductor device according to claim 31, wherein said output layer is polycrystalline silicon.

34. An MOS semiconductor device according to claim 31, wherein said power supply line is a ground line.

35. An MOS semiconductor device which comprises;
a semiconductor substrate;
an insulation layer disposed upon said substrate;
a metal wiring layer having a first side and a second side, formed on said insulation layer, and serving as a power supply line;
an input metal wiring layer for supplying an input signal and formed along said first side of said metal wiring layer;
an opening formed in said metal wiring layer;
a metal contact layer formed in said opening and isolated from said metal wiring layer;
at least a pair of complementary MOSFETs comprising an N type MOSFET and p type MOSFET, respectively, each having a drain, source, and gate, and each formed below said metal wiring layer;
a polycrystalline silicon input layer operatively coupled to and extending from said input metal wiring layer to the gate of one of said complementary MOSFETs;
means for connecting said drain of another of said complementary MOSFETs to said contact layer; and
an output layer operatively coupled to and extending from said contact layer beyond said second side of said metal wiring layer.

36. An MOS semiconductor device according to claim 35, wherein said opening is formed at a position midway between said first and second sides of said metal wiring layer.

37. An MOS semiconductor device according to claim 35, wherein said output layer is polycrystalline silicon.

38. An MOS semiconductor device according to claim 35, wherein said power supply line is a ground line.

* * * * *